United States Patent
Yoshino et al.

(10) Patent No.: US 12,022,620 B2
(45) Date of Patent: Jun. 25, 2024

(54) TRAY PARTS FEEDER

(71) Applicant: FUJI CORPORATION, Chiryu (JP)

(72) Inventors: Tomoharu Yoshino, Nagoya (JP); Shunji Morikawa, Toyoake (JP)

(73) Assignee: FUJI CORPORATION, Chiryu (JP)

( * ) Notice: Subject to any disclaimer, the term of this patent is extended or adjusted under 35 U.S.C. 154(b) by 172 days.

(21) Appl. No.: 17/628,864

(22) PCT Filed: Jul. 22, 2019

(86) PCT No.: PCT/JP2019/028710
§ 371 (c)(1),
(2) Date: Jan. 20, 2022

(87) PCT Pub. No.: WO2021/014545
PCT Pub. Date: Jan. 28, 2021

(65) Prior Publication Data
US 2022/0256747 A1    Aug. 11, 2022

(51) Int. Cl.
*H05K 13/02*    (2006.01)
*B65G 65/00*    (2006.01)
*H05K 13/00*    (2006.01)

(52) U.S. Cl.
CPC ......... *H05K 13/02* (2013.01); *H05K 13/0015* (2013.01)

(58) Field of Classification Search
None
See application file for complete search history.

(56) References Cited

U.S. PATENT DOCUMENTS 5,380,138 A * 1/1995 Kasai ................. B65G 65/00
414/277

FOREIGN PATENT DOCUMENTS

| EP | 2 874 481 A1 | 5/2015 |
| EP | 3 419 403 A1 | 12/2018 |
| JP | 5-8130 A | 1/1993 |
| JP | H058130 A * | 5/1993 |
| JP | 7-17602 A | 1/1995 |
| JP | 10-242689 A | 9/1998 |
| JP | 2000-91795 A | 3/2000 |
| JP | 3123037 B2 | 1/2001 |
| WO | WO 2014/010083 A1 | 1/2014 |
| WO | WO 2014/010084 A1 | 1/2014 |

OTHER PUBLICATIONS

International Search Report mailed on Oct. 15, 2019 in PCT/JP2019/028710 filed on Jul. 22, 2019, 4 pages.

* cited by examiner

*Primary Examiner* — Kavel Singh
(74) *Attorney, Agent, or Firm* — Oblon, McClelland, Maier & Neustadt, L.L.P.

(57) ABSTRACT

A tray-type component supply device includes a device main body, a magazine configured to be detachably held by the device main body and to accommodate multiple trays in each of which multiple components are arranged vertically, a shuttle mechanism configured to draw any of the trays from the magazine to enable the components to be supplied, a lifting/lowering mechanism configured to move the magazine or the shuttle mechanism up and down to select a tray to be drawn by the shuttle mechanism, and an automatic exchange section configured to exchange the magazine to be collected from the device main body and the magazine to be provided to the device main body.

13 Claims, 5 Drawing Sheets

TRAY PARTS FEEDER

TECHNICAL FIELD

The present specification relates to a tray-type component supply device that supplies components by using a tray.

BACKGROUND ART

Examples of a board work machine for producing a board product on which multiple components are mounted include a solder printer, a component mounter, a reflow machine, and a board inspection machine. These board work machines are generally provided in a row to constitute a board production line. In them, the component mounter may include a tray-type component supply device using a tray on which components are arranged. Generally, a tray-type component supply device holds multiple trays and supplies multiple types of components by exchanging the trays when the components are consumed. Technical examples of such a tray-type component supply device are disclosed in Patent Literatures 1 and 2.

Patent Literature 1 discloses a component mounting system that provides tray components by using a replenishing unit mounted on a traveling body that travels between a component storage container and multiple component mounters. In this system, trays in which tray components are arranged are delivered between a magazine on the traveling body side and a magazine on the component mounter side by a tray feeding mechanism. According to such a configuration, it is said that the provision and collection of the tray can be automatically performed, and thus necessary components can be automatically and efficiently provided.

A chip supplying device in Patent Literature 2 includes a magazine that accommodates multiple trays arranged vertically, a holder that suspends and holds the magazine, and means for moving the holder up and down, and a lower space into and out of which a wheeled table enters and exits below the magazine is secured. With this configuration, it is said that an operator can perform an exchange operation the magazine by using the wheeled table.

PATENT LITERATURE

Patent Literature 1: International Publication No. WO2014/010084
Patent Literature 2: JP-A-7-17602

BRIEF SUMMARY

Technical Problem

However, in the technique in Patent Literature 1, trays are automatically delivered one by one, and thus multiple trays accommodated in the magazine cannot be collectively exchanged. Therefore, in a case where multiple trays are exchanged in a setup change task or the like for changing the type of board to be produced, an exchange operation is complicated and the required time is also increased. On the other hand, in the technique in Patent Literature 2, magazines can be collectively exchanged, but automation is not achieved since an exchange operation is performed by an operator.

An object of the present specification is to provide a tray-type component supply device capable of automatically exchanging magazines accommodating multiple trays.

Solution to Problem

According to the present specification, there is provided a tray-type component supply device including a device main body; a magazine configured to be detachably held by the device main body and to vertically accommodate multiple trays in each of which multiple components are arranged; a shuttle mechanism configured to draw any of the trays from the magazine to enable the components to be supplied; a lifting/lowering mechanism configured to move the magazine or the shuttle mechanism up and down to select a tray to be drawn by the shuttle mechanism; and an automatic exchange section configured to exchange the magazine to be collected from the device main body and the magazine to be provided to the device main body.

Advantageous Effect of the Invention

In the tray-type component supply device disclosed in the present specification, since the automatic exchange section exchanges the magazine to be collected from the device main body and the magazine to be provided to the device main body, it is possible to automatically exchange the magazines accommodating multiple trays.

DESCRIPTION OF EMBODIMENTS

Figure 1:
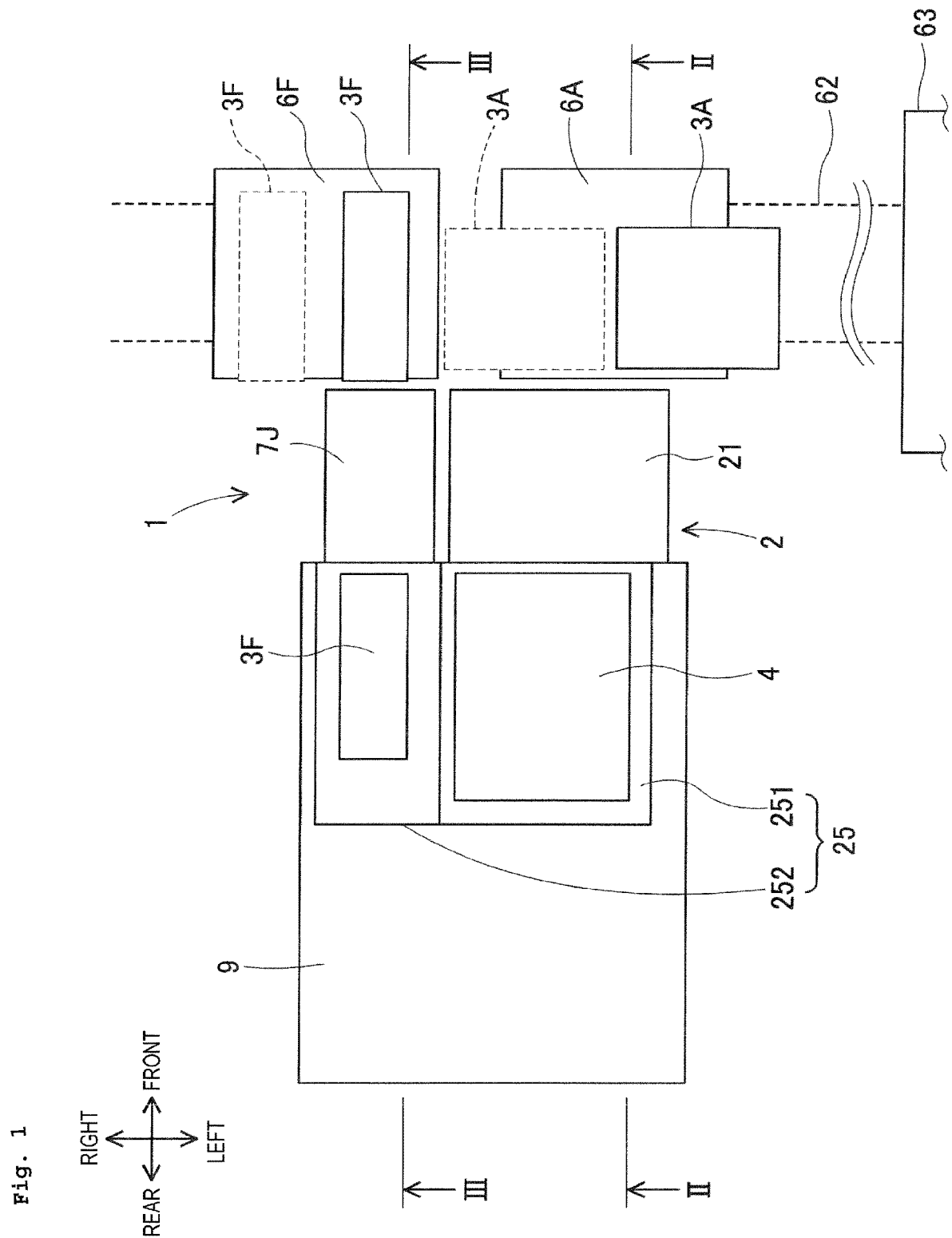
FIG. 1 is a plan view schematically illustrating a configuration of a tray-type component supply device according to an embodiment.
Figure 2:
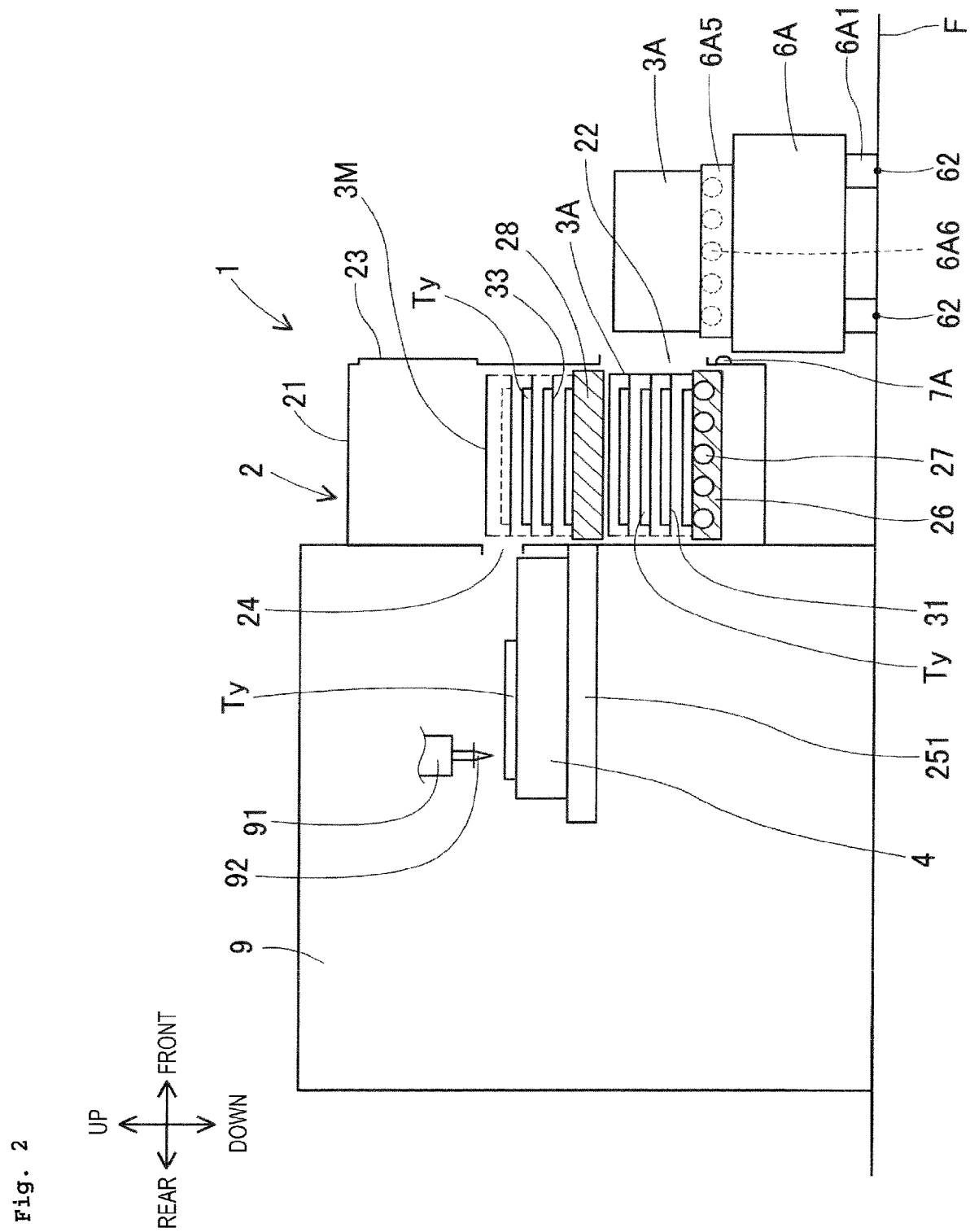
FIG. 2 is a view taken along an arrow II-II in FIG. 1, and is a partially sectional side view including a magazine of the tray-type component supply device.
Figure 3:
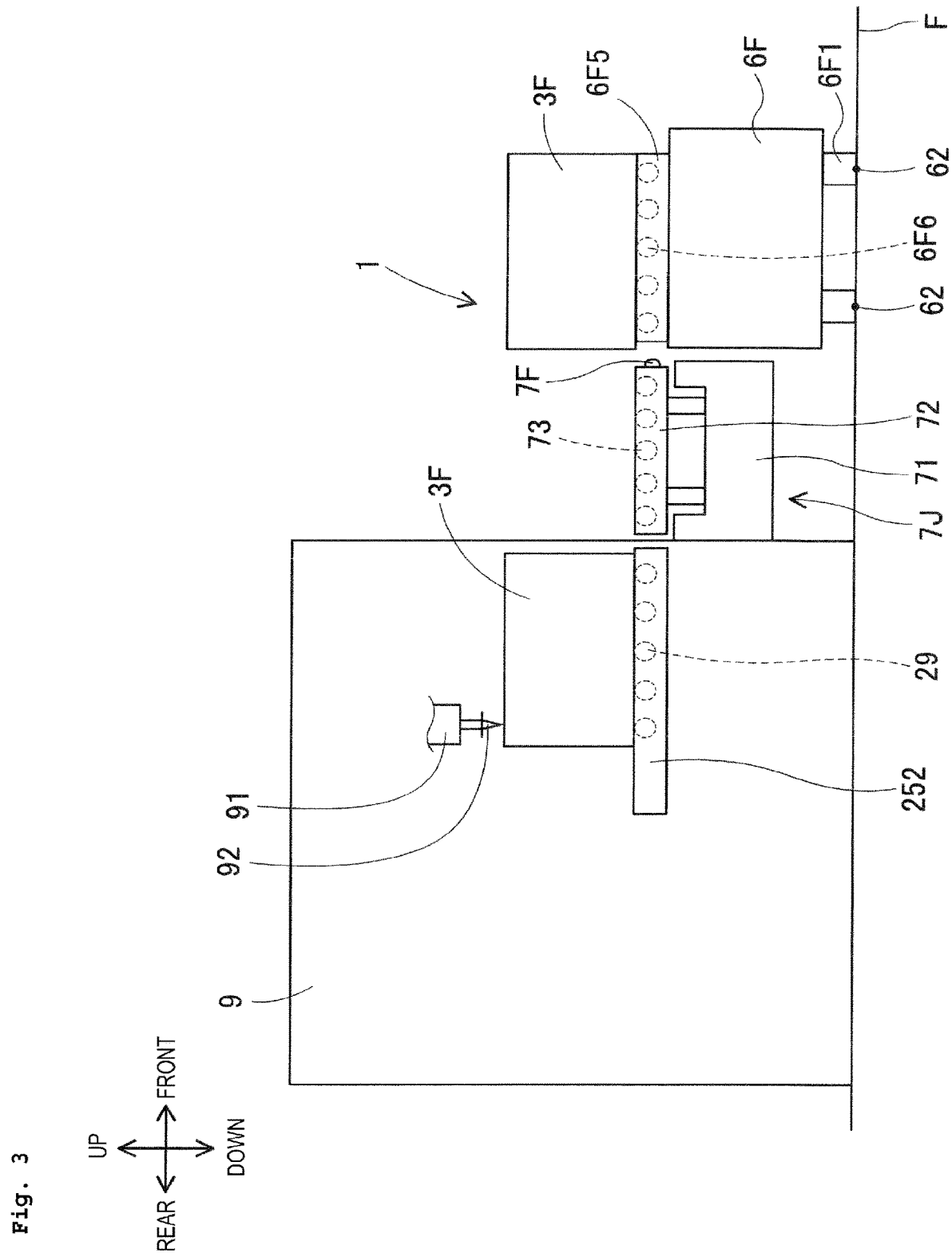
FIG. 3 is a view taken along an arrow III-Ill in FIG. 1, and is a partially sectional side view including a feeder device of the tray-type component supply device.

1. Configuration Regarding Magazines (3A, 3M) of Tray-Type Component Supply Device 1 of Embodiment A configuration of tray-type component supply device 1 according to the embodiment will be described with reference to device configuration diagrams of FIGS. 1 to 3, and control configuration diagrams of FIGS. 4 and 5. In the plan view of FIG. 1, front-rear left-right directions common to component mounter 9 and tray-type component supply device 1 are determined for convenience. External lines of component mounter 9 are illustrated in FIGS. 1 to 3, and mounting head 91 and suction nozzle 92 provided in component mounter 9 are illustrated in FIGS. 2 and 3.

Tray-type component supply device 1 is provided on the front side of component mounter 9. Tray-type component supply device 1 supplies components to component mounter 9 by using tray Ty in which multiple components are arranged. Tray-type component supply device 1 includes device main body 2, automatic magazine 3A, manual magazine 3M, shuttle mechanism 4, lifting/lowering mechanism 5 (refer to FIG. 4), magazine automatic exchange section 6A, feeder device 3F, feeder automatic exchange section 6F, two height detection sections 7A and 7F, height adjustment section 7J, and control device 8 (refer to FIG. 4 and FIG. 5).

Device main body 2 includes main body case 21, inserting section 25, lower holding table 26, upper holding table 28, and the like. Main body case 21 is formed in a vertically long rectangular parallelepiped shape. Main body case 21 is disposed in the vicinity of a front edge of component mounter 9. An automatic exchange window 22 that is larger than the size of automatic magazine 3A is open close to a lower part of a front surface of main body case 21. Maintenance door 23 that is larger than the size of manual magazine 3M and can be opened and closed is provided close to an upper part of the front surface of main body case 21. Drawer window 24 that is larger than the size of tray Ty is open at a substantially mid-height of a rear surface of main body case 21.

Inserting section 25 is provided on the rear surface of main body case 21. Inserting section 25 is inserted into the inside of component mounter 9. Inserting section 25 includes shuttle supporting section 251 and feeder holding section 252. Shuttle supporting section 251 is a rectangular plate-like member disposed horizontally. Shuttle supporting section 251 is disposed at a position close to the left of component mounter 9 and slightly lower than drawer window 24. Feeder holding section 252 is a rectangular plate-like member disposed horizontally. Feeder holding section 252 is disposed at a position close to the right of component mounter 9 and higher than shuttle supporting section 251.

Lower holding table 26 is disposed to be movable up and down inside main body case 21. Lower holding table 26 is a rectangular thick plate-like member. Lower holding table 26 has multiple transport rollers 27 disposed to be arranged in the front-rear direction and the left-right direction. Upper holding table 28 is disposed above lower holding table 26 inside main body case 21 so as to be movable up and down. Upper holding table 28 is a rectangular thick plate-like member.

Automatic magazine 3A is formed in a box shape having a height less than half of main body case 21. Automatic magazine 3A is detachably held on the upper side of lower holding table 26. A load of held automatic magazine 3A is supported by transport rollers 27. Transport rollers 27 are an embodiment of a main body side magazine driving section that transports automatic magazine 3A by being rotated in a state in which automatic magazine 3A is placed thereon.

Multiple holding shelves 31 are provided to be arranged vertically inside automatic magazine 3A. Tray Ty is housed in each holding shelf 31. Multiple components are arranged in a two-dimensional lattice in each tray Ty. The rear part of automatic magazine 3A is open, and thus tray Ty can be drawn rearward. A tray pallet (not illustrated) on which tray Ty is placed may be housed in each holding shelf 31, and tray Ty and the tray pallet may be drawn together.

Automatic magazine 3A faces automatic exchange window 22 by adjusting a height position. Automatic magazine 3A is transported to the front side of lower holding table 26 due to reverse rotation of transport rollers 27, and passes through automatic exchange window 22 toward the front side. As a result, automatic magazine 3A is detached from device main body 2. Automatic magazine 3A is transported from the front side through automatic exchange window 22 to lower holding table 26 due to forward rotation of transport rollers 27. As a result, automatic magazine 3A is provided to device main body 2.

Manual magazine 3M is formed in a box shape having a height less than half of main body case 21 in the same manner as automatic magazine 3A. Manual magazine 3M is held on the upper side of upper holding table 28. Multiple holding shelves 33 are provided to be arranged vertically inside manual magazine 3M. Tray Ty is housed in each holding shelf 33. Multiple components are arranged in a two-dimensional lattice in each tray Ty. Manual magazine 3M and automatic magazine 3A may have the same shape.

The rear part of manual magazine 3M is open, and thus tray Ty can be drawn rearward. Manual magazine 3M faces maintenance door 23 by adjusting a height position. The front part of manual magazine 3M is open, and thus maintenance is performed through maintenance door 23. For example, an operator can provide components by exchanging tray Ty or inspect the inside of manual magazine 3M through maintenance door 23. The operator may exchange entire manual magazine 3M.

Figure 4:
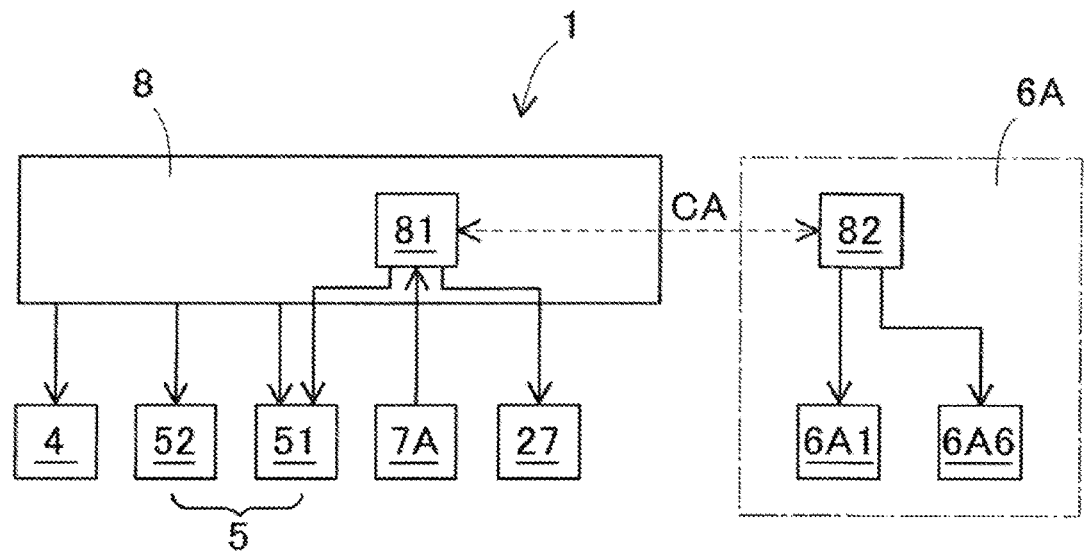
FIG. 4 is a block diagram illustrating a configuration of control related to operations of the magazine and a tray of the tray-type component supply device.

Lifting/lowering mechanism 5 separately moves automatic magazine 3A and manual magazine 3M up and down. Lifting/lowering mechanism 5 is controlled such that collision between automatic magazine 3A and manual magazine 3M is avoided. Lifting/lowering mechanism 5 has a function of selecting tray Ty to be drawn from drawer window 24. As illustrated in FIG. 4, lifting/lowering mechanism 5 includes first lifting/lowering mechanism 51 that drives automatic magazine 3A to be moved up and down together with lower holding table 26, and second lifting/lowering mechanism 52 that drives manual magazine 3M to be moved up and down together with upper holding table 28. Examples of first lifting/lowering mechanism 51 and second lifting/lowering mechanism 52 include a ball screw feeding mechanism driven by a motor.

Shuttle mechanism 4 is provided on the upper side of shuttle supporting section 251. Shuttle mechanism 4 draws any tray Ty from automatic magazine 3A or manual magazine 3M such that components can be supplied. Shuttle mechanism 4 has a locking section that locks a locking target section provided on tray Ty or the tray pallet, and is drawn from main body case 21 or returned to main body case 21. In FIG. 2, tray Ty on the uppermost side of manual magazine 3M is drawn. Suction nozzle 92 is moved down toward drawn tray Ty, and picks up a component by being supplied with a negative pressure.

Magazine automatic exchange section 6A exchanges automatic magazine 3A to be collected from device main body 2 and automatic magazine 3A to be provided to device main body 2. As illustrated in FIG. 2, magazine automatic exchange section 6A is configured to have a form of an unmanned conveyance vehicle including traveling wheels 6A1 corresponding to a traveling section. Traveling wheels 6A1 travel along traveling path 62 following component warehouse 63. As a result, magazine automatic exchange section 6A reciprocates and travels between component warehouse 63 and component mounter 9. A position marker for controlling a traveling position of magazine automatic exchange section 6A is appropriately disposed in the vicinity of traveling path 62. Magazine automatic exchange section 6A detects the position marker to recognize the current position.

Two accommodation sections 6A5 that accommodate automatic magazine 3A are provided on the upper side of magazine automatic exchange section 6A. Automatic magazine 3A to be provided is placed in first accommodation section 6A5. Automatic magazine 3A to be collected is placed in second accommodation section 6A5. In FIG. 1, automatic magazine 3A to be provided is indicated by solid lines, and automatic magazine 3A to be collected is indicated by dashed lines. Without being limited to this, magazine automatic exchange section 6A may travel while accommodating two automatic magazines 3A, or may travel while accommodating one or no automatic magazine 3A.

Accommodation section 6A5 has multiple transport rollers 6A6 disposed to be arranged in the front-rear direction and the left-right direction. The load of automatic magazine 3A accommodated in accommodation section 6A5 is supported by transport rollers 6A6. Transport rollers 6A6 are an embodiment of an exchange side magazine driving section that transports automatic magazine 3A by being rotated in a state in which automatic magazine 3A is placed thereon. Transport rollers 6A6 deliver automatic magazine 3A together with transport rollers 27 on device main body 2 side.

Specifically, prior to the delivery, transport rollers 6A6 and transport rollers 27 are disposed to be arranged in the front-rear direction. Automatic magazine 3A to be provided is directed rearward from accommodation section 6A5 due to forward rotation of transport rollers 6A6. Automatic magazine 3A to be provided is provided into the inside of device main body 2 from automatic exchange window 22 due to forward rotation of transport rollers 27. Automatic magazine 3A to be collected is detached from the inside of device main body 2 through automatic exchange window 22 due to reverse rotation of transport rollers 27. Automatic magazine 3A to be collected is accommodated in accommodation section 6A5 due to reverse rotation of transport rollers 6A6.

Since magazine automatic exchange section 6A reciprocates between component warehouse 63 and component mounter 9, there is concern that a height relationship between device main body 2 and magazine automatic exchange section 6A may change. For example, a height position of accommodation section 6A5 varies due to a status change of traveling path 62 and floor surface F, an individual difference between multiple magazine automatic exchange sections 6A, or the like. As a countermeasure against this, height detection section 7A is provided, and first lifting/lowering mechanism 51 functions as a height adjustment section.

Height detection section 7A is disposed below automatic exchange window 22 on the front surface of main body case 21. Height detection section 7A detects a height of accommodation section 6A5 that is substantially opposed thereto. Examples of height detection section 7A include, but are not limited to, a sensor of a detection type that reads a linear scale attached to extend in the up-down direction of accommodation section 6A5.

First lifting/lowering mechanism 51 corresponding to a height adjustment section adjusts a height of automatic magazine 3A to be collected, that is, a height position of lower holding table 26, based on a detected height of accommodation section 6A5. Consequently, a height of the lower end of automatic magazine 3A to be collected coincides with the height of the upper part of accommodation section 6A5. First lifting/lowering mechanism 51 adjusts a height thereof, that is, a height position of lower holding table 26, in accordance with automatic magazine 3A to be provided based on the detected height of accommodation section 6A5. Consequently, the height of the lower end of automatic magazine 3A to be provided coincides with the height of the upper part of lower holding table 26. Therefore, since a step in the height direction is eliminated in a case where automatic magazine 3A is transported, a smooth exchange operation can be realized.

2. Configuration Regarding Feeder Device 3F of Tray-Type Component Supply Device 1

Feeder device 3F is disposed above feeder holding section 252 and is positioned by a lock mechanism (not illustrated). In the present embodiment, feeder device 3F includes a feeder pallet and multiple feeders (the reference numeral thereof is not illustrated). Specifically, the plate-like feeder pallet is provided with multiple slots extending in the front-rear direction. The feeder is provided to be fitted into each slot. Each feeder unwinds a carrier tape holding multiple components to supply the components. Feeder device 3F is not limited to this, and may be configured with a single feeder.

Feeder holding section 252 has multiple transport rollers 29 disposed to be arranged in the front-rear direction and the left-right direction. A load of feeder device 3F held by feeder holding section 252 is supported by transport rollers 29. Transport rollers 29 is an embodiment of a main body side feeder driving section that transports feeder device 3F by being rotated in a state where feeder device 3F is placed thereon.

Feeder automatic exchange section 6F exchanges feeder device 3F to be collected from device main body 2 and feeder device 3F to be provided to device main body 2. As illustrated in FIG. 3, feeder automatic exchange section 6F includes traveling wheels 6F1 corresponding to a traveling section, and is configured in a form of an unmanned conveyance vehicle. Since traveling wheels 6F1 travel along traveling path 62 following component warehouse 63, feeder automatic exchange section 6F reciprocates and travels between component warehouse 63 and component mounter 9. Feeder automatic exchange section 6F may have the same shape as that of magazine automatic exchange section 6A, or may have a different shape.

Component warehouse 63 stores at least one of feeder device 3F and the carrier tape. Component warehouse 63 stores at least one of automatic magazine 3A and tray Ty. Therefore, an operator can perform preparation work for automatic magazine 3A or feeder device 3F to be provided in component warehouse 63. Feeder automatic exchange section 6F conveys and provides prepared feeder device 3F to device main body 2. Feeder automatic exchange section 6F conveys and brings back collected feeder device 3F to component warehouse 63.

Similarly, magazine automatic exchange section 6A conveys and provides prepared automatic magazine 3A to device main body 2. Magazine automatic exchange section 6A conveys and brings back collected automatic magazine 3A to component warehouse 63. Component warehouse 63 and traveling path 62 are common to feeder automatic exchange section 6F and magazine automatic exchange section 6A, but may be provided separately.

Two accommodation sections 6F5 that accommodate feeder device 3F are provided on the upper side of feeder automatic exchange section 6F. Feeder device 3F to be provided is placed in first accommodation section 6F5. Feeder device 3F to be collected is placed in second accommodation section 6F5. In FIG. 1, feeder device 3F to be provided is indicated by solid lines, and feeder device 3F to be collected is indicated by dashed lines. Without being limited to this, feeder automatic exchange section 6F may travel while accommodating two feeder devices 3F, or may travel while accommodating no feeder devices 3F.

Accommodation section 6F5 has multiple transport rollers 6F6 disposed to be arranged in the front-rear direction and the left-right direction. The load of feeder device 3F accommodated in accommodation section 6F5 is supported by transport rollers 6F6. Transport rollers 6F6 is an embodiment of an exchange side feeder driving section that transports feeder device 3F by being rotated in a state in which feeder device 3F is placed thereon. Transport rollers 6F6 deliver feeder device 3F together with transport rollers 29 on device main body 2 side and transport rollers 73 of height adjustment section 7J that will be described later.

Since feeder automatic exchange section 6F reciprocates between component warehouse 63 and component mounter 9, there is concern that a height relationship between device main body 2 and feeder automatic exchange section 6F may change. For example, a height position of accommodation section 6F5 varies due to a status change of traveling path 62 and floor surface F, an individual difference between multiple feeder automatic exchange sections 6F, or the like. As a countermeasure against this, height detection section 7F and height adjustment section 7J are provided.

Height adjustment section 7J is disposed between feeder automatic exchange section 6F and device main body 2. Height adjustment section 7J includes main body 71 and intermediate accommodation section 72 that is operated to be moved up and down with respect to main body 71. A height position of intermediate accommodation section 72 substantially coincides with a height position of feeder holding section 252 or a height position of accommodation section 6F5 of feeder automatic exchange section 6F, and an adjustment range is set in both the up and down directions. Intermediate accommodation section 72 temporarily accommodates feeder device 3F passing therethrough in the front-rear direction.

Intermediate accommodation section 72 has multiple transport rollers 73 disposed to be arranged in the front-rear direction and the left-right direction. The load of feeder device 3F accommodated in the intermediate accommodation section 72 is supported by transport rollers 73. Transport rollers 73 are an embodiment of an intermediate feeder driving section that transports feeder device 3F by being rotated in a state in which feeder device 3F is placed thereon.

Height detection section 7F is disposed on a front surface of intermediate accommodation section 72. Height detection section 7F detects a height of accommodation section 6F5 that is substantially opposed thereto. Height detection section 7F may be of the same detection type as that of height detection section 7A of magazine automatic exchange section 6A, or may be of a different detection type.

Height adjustment section 7J moves feeder device 3F up and down by moving intermediate accommodation section 72 up and down based on the detected height of accommodation section 6F5. Consequently, in a case where feeder device 3F is transported between accommodation section 6F5 and intermediate accommodation section 72, there is no step in the height direction. In a case where feeder device 3F is transported between intermediate accommodation section 72 and feeder holding section 252, there is no step in the height direction. Therefore, a smooth exchange operation for feeder device 3F is realized.

Prior to the delivery of feeder device 3F, transport rollers 6F6, transport rollers 73, and transport rollers 29 are disposed to be arranged linearly in the front-rear direction. Feeder device 3F to be provided is transported from feeder automatic exchange section 6F to device main body 2 via height adjustment section 7J due to forward rotation of transport rollers 6F6, transport rollers 73, and transport rollers 29. The lock mechanism of feeder device 3F to be collected is first released. Thereafter, feeder device 3F to be collected is transported from device main body 2 to feeder automatic exchange section 6F via height adjustment section 7J due to reverse rotation of transport rollers 29, transport rollers 73, and transport rollers 6F6.

3. Configuration Related to Control of Tray-Type Component Supply Device 1

Next, a configuration related to control of tray-type component supply device 1 will be described with reference to FIGS. 4 and 5. Control device 8 is configured by using a computer device having a CPU and operating in software. Control device 8 is provided on device main body 2, and an installation position thereof is not particularly limited. As illustrated in FIG. 4, control device 8 controls first lifting/lowering mechanism 51 and second lifting/lowering mechanism 52 of lifting/lowering mechanism 5 to select tray Ty, and controls shuttle mechanism 4 to put tray Ty in and out.

Control device 8 includes main body side control section 81 that performs control related to exchange of automatic magazine 3A. Main body side control section 81 acquires a detection result from height detection section 7A. Main body side control section 81 controls switching between forward rotation, reverse rotation, and stoppage of transport rollers 27. On the other hand, main body side control section 81 controls an operation of first lifting/lowering mechanism 51 as a height adjustment section.

On the other hand, magazine automatic exchange section 6A includes exchange side control section 82 that performs control related to exchange of automatic magazine 3A. Exchange side control section 82 controls traveling wheels 6A1 to position magazine automatic exchange section 6A at a predetermined exchange execution position. The exchange execution position is a position at which any of accommodation sections 6A5 is opposed to automatic exchange window 22, and there are two positions. Exchange side control section 82 controls switching between forward rotation, reverse rotation, and stoppage of transport rollers 6A6.

Main body side control section 81 and exchange side control section 82 transmit and receive control information CA regarding the delivery of automatic magazine 3A via a wireless communication section (not illustrated). Control information CA transmitted from exchange side control section 82 to main body side control section 81 includes, for example, information indicating that magazine automatic exchange section 6A has been positioned at the exchange execution position, information indicating that sending of automatic magazine 3A to be provided has been started, and information indicating that reception of automatic magazine 3A to be collected has been finished.

Control information CA transmitted from main body side control section 81 to exchange side control section 82, for example, includes information indicating that adjustment of the height position of lower holding table 26 by first lifting/lowering mechanism 51 has been finished, information indicating that sending of automatic magazine 3A to be collected has been started, and information indicating that reception of automatic magazine 3A to be provided has been finished. Main body side control section 81 and exchange side control section 82 jointly control an operation of exchanging automatic magazine 3A with reference to control information CA mutually transmitted and received.

Figure 5:
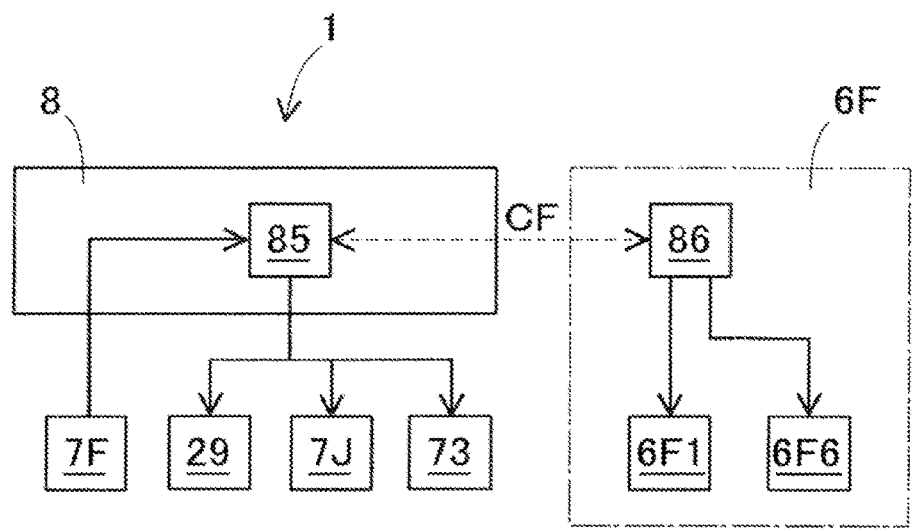
FIG. 5 is a block diagram illustrating a configuration of control related to exchange of the feeder device of the tray-type component supply device.

As illustrated in FIG. 5, control device 8 includes main body side control section 85 that performs control related to exchange of feeder device 3F. Main body side control section 85 acquires a detection result from height detection section 7F. Main body side control section 85 controls switching between forward rotation, reverse rotation, and stoppage of transport rollers 29 and transport rollers 73.

Main body side control section 85 controls a height position of intermediate accommodation section 72 of height adjustment section 7J.

On the other hand, feeder automatic exchange section 6F includes exchange side control section 86 that controls exchange of feeder device 3F. Exchange side control section 86 controls traveling wheels 6F1 to position feeder automatic exchange section 6F at a predetermined exchange execution position. The exchange execution position is a position at which any of accommodation sections 6F5 is opposed to feeder holding section 252, and there are two positions. Exchange side control section 86 controls switching between forward rotation, reverse rotation, and stoppage of transport rollers 6F6.

Main body side control section 85 and exchange side control section 86 transmit and receive control information CF regarding the delivery of feeder device 3F via a wireless communication section (not illustrated). Control information CF transmitted from exchange side control section 86 to main body side control section 85 includes, for example, information indicating that feeder automatic exchange section 6F has been positioned at the exchange execution position, information indicating that sending of feeder device 3F to be provided has been started, and information indicating that reception of feeder device 3F to be collected has been finished.

Control information CF transmitted from main body side control section 85 to exchange side control section 86 includes, for example, information indicating that adjustment of a height position of height adjustment section 7J has been finished, information indicating that sending of feeder device 3F to be collected has been started, and information indicating that reception of feeder device 3F to be provided has been finished. Main body side control section 85 and exchange side control section 86 jointly control an operation of exchanging feeder device 3F with reference to control information CF mutually transmitted and received.

4. Operation of Tray-Type Component Supply Device 1

Next, an operation when tray-type component supply device 1 exchanges automatic magazine 3A will be described with reference to an operation flow illustrated in FIG. 6. Prior to execution of the operation flow, automatic magazine 3A to be provided to first accommodation section 6A5 of magazine automatic exchange section 6A is accommodated, and second accommodation section 6A5 is in an empty state. Magazine automatic exchange section 6A travels to a position in the vicinity of component mounter 9.

Figure 6:
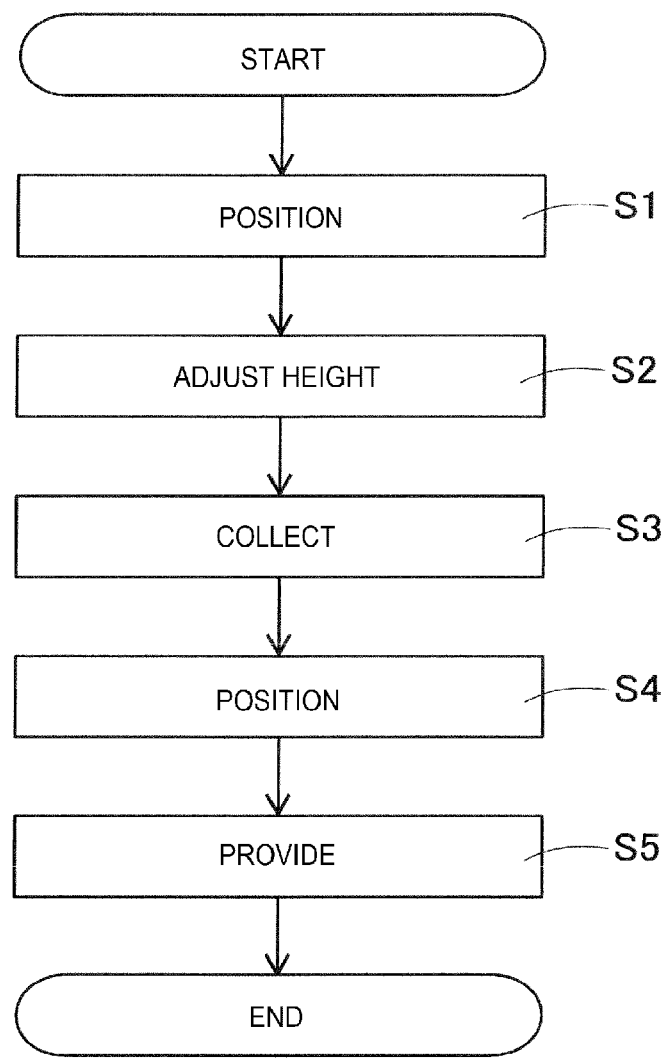
FIG. 6 is a diagram illustrating an operation flow when the tray-type component supply device exchanges an automatic magazine.

In step S1 in FIG. 6, magazine automatic exchange section 6A is positioned at the first exchange execution position. In this case, empty accommodation section 6A5 is opposed to automatic exchange window 22. In the next step S2, height detection section 7A detects an exchange height at which empty accommodation section 6A5 collects automatic magazine 3A. First lifting/lowering mechanism 51 adjusts a height of automatic magazine 3A to be collected based on the detected exchange height of accommodation section 6A5. In the next step S3, under the joint control of main body side control section 81 and exchange side control section 82, transport rollers 27 and transport rollers 6A6 are jointly operated to collect automatic magazine 3A accommodated in device main body 2 into empty accommodation section 6A5. In the next step S4, magazine automatic exchange section 6A is positioned at a second exchange execution position. In this case, accommodation section 6A5 in which automatic magazine 3A to be provided is accommodated is opposed to automatic exchange window 22. In the next step S5, under the joint control of main body side control section 81 and exchange side control section 82, transport rollers 6A6 and transport rollers 27 are jointly operated to provide automatic magazine 3A of accommodation section 6A5 to device main body 2.

Also in an operation of exchanging feeder device 3F, the fact that collecting is performed first and provision is performed next is the same, and detailed descriptions thereof will be omitted. However, height adjustment section 7J adjusts the height of feeder device 3F to be transported in both collecting and provision.

In tray-type component supply device 1 of the embodiment, since magazine automatic exchange section 6A exchanges automatic magazine 3A collected from device main body 2 and automatic magazine 3A provided to device main body 2, it is possible to automatically exchange automatic magazines 3A accommodating multiple trays Ty.

Since manual magazine 3M is used together, it is possible to supply components from manual magazine 3M when automatic magazine 3A is exchanged, and a mounting operation of component mounter 9 is not interrupted. Since magazine automatic exchange section 6A travels to component warehouse 63, it is possible to contribute to labor saving and automation of component warehouse 63. Since tray-type component supply device 1 includes feeder automatic exchange section 6F, the exchange of feeder device 3F can also be automated.

5. Application and Modification of Embodiment

Height detection section (7A, 7F) or height adjustment section 7J may be provided on the side of magazine automatic exchange section 6A or feeder automatic exchange section 6F. A configuration in which feeder device 3F, feeder automatic exchange section 6F, and height adjustment section 7J are omitted may be employed. Shuttle mechanism 4 may be used to exchange tray Ty between automatic magazine 3A and manual magazine 3M. Consequently, work of an operator on manual magazine 3M is saved.

Manual magazine 3M may not be provided, and only automatic magazine 3A may be provided. In this aspect, there may be a configuration in which a height position of automatic magazine 3A is made constant, and lifting/lowering mechanism 5 drives shuttle mechanism 4 to be moved up and down to select tray Ty to be drawn. There may be a configuration in which transport rollers 27 may be provided on upper holding table 28 and lower holding table 26, and thus magazine automatic exchange section 6A may automatically exchange automatic magazine 3A with respect to either upper holding table 28 or lower holding table 26.

Magazine automatic exchange section 6A and feeder automatic exchange section 6F need not be in the form of an unmanned conveyance vehicle, and may be of a stationary type. Alternatively, even in the form of an unmanned conveyance vehicle, accommodation section (6A5, 6F5) may be configured to be small enough to neglect a change in a height position thereof. In this aspect, height detection section (7A, 7F) and height adjustment section 7J are not necessary. Various other applications and modifications of the embodiment are possible.

REFERENCE SIGNS LIST

1: Tray-type component supply device, 2: Device main body, 21: Main body case, 26: Lower holding table, 27: Transport roller, 28: Upper holding table, 29: Transport roller, 3A: Automatic magazine, 3M: Manual magazine, 3F: Feeder device, 4: Shuttle mechanism, 5: Lifting/lowering mechanism, 51: First Lifting/lowering mechanism, 52: Second Lifting/lowering mechanism, 6A: Magazine automatic exchange section, 6A1: Traveling wheel, 6A5: Accommodation section, 6A6: Transport roller, 6F: Feeder automatic exchange section, 6F1: Traveling wheel, 6F5: Accommodation section, 6F6: Transport roller, 63: Component warehouse, 7A: Height detection section, 7F: Height detection section, 7J: Height adjustment section, 72: Intermediate accommodation section, 73: Transport roller, 8: Control device, 81: Main body side control section, 82: exchange side control section, 85: Main body side control section, 86: Exchange side control section, Ty: tray, CA: Control information, CF: Control information.

The invention claimed is:

1. A tray-type component supply device comprising:
a device main body;
a magazine configured to be detachably held by the device main body and to vertically accommodate multiple trays in each of which multiple components are arranged;
a shuttle mechanism configured to draw any of the trays from the magazine to enable the components to be supplied;
a lifting/lowering mechanism in the device main body configured to move the magazine up and down to select the tray to be drawn by the shuttle mechanism;
an automatic exchange section configured to exchange a magazine to be collected from the device main body and a magazine to be provided to the device main body;
a height detection section configured to detect a height relationship between the device main body and the automatic exchange section; and
a height adjustment section that adjusts a height of the magazine to be collected with the lifting/lowering mechanism based on the height relationship.

2. The tray-type component supply device according to claim 1, wherein
the automatic exchange section has a traveling section configured to travel to a component warehouse that stores at least one of the magazine and the tray.

3. The tray-type component supply device according to claim 2, wherein
the height adjustment section is configured to adjust an operation of exchanging the magazine based on the detected height relationship.

4. The tray-type component supply device according to claim 1, wherein
the automatic exchange section has an accommodation section configured to accommodate the magazine to be collected and the magazine to be provided,
the height detection section is provided in the device main body to detect a height of the accommodation section of the automatic exchange section, and
the lifting/lowering mechanism adjusts the height of the magazine to be collected based on the detected height of the accommodation section, and adjusts a height of the lifting/lowering mechanism in accordance with the magazine to be provided.

5. The tray-type component supply device according to claim 1, wherein
the automatic exchange section has an exchange side magazine driving section and an exchange side control section configured to control the exchange side magazine driving section, and
the device main body has a main body side magazine driving section configured to deliver the magazine in cooperation with the exchange side magazine driving section, and a main body side control section configured to transmit and receive control information regarding delivery of the magazine to and from the exchange side control section to control the main body side magazine driving section.

6. The tray-type component supply device according to claim 5, wherein
the exchange side magazine driving section and the main body side magazine driving section are transport rollers configured to transport the magazine by being rotated in a state in which the magazine is placed thereon.

7. The tray-type component supply device according to claim 1, wherein
the magazine includes an automatic magazine to be exchanged by the automatic exchange section and a manual magazine to which the components are provided by an operator, and
the lifting/lowering mechanism moves the multiple magazines up and down separately.

8. A tray-type component supply device comprising:
a device main body;
a magazine configured to be detachably held by the device main body and to vertically accommodate multiple trays in each of which multiple components are arranged;
a shuttle mechanism configured to draw any of the trays from the magazine to enable the components to be supplied;
a lifting/lowering mechanism configured to move the magazine or the shuttle mechanism up and down to select the tray to be drawn by the shuttle mechanism; and
an automatic exchange section configured to exchange a magazine to be collected from the device main body and a magazine to be provided to the device main body, wherein
the device main body detachably holds a feeder device that unwinds a carrier tape holding multiple components to supply the components, and
the automatic exchange section exchanges the feeder device to be collected from the device main body and the feeder device to be provided to the device main body in addition to exchanging the magazines.

9. The tray-type component supply device according to claim 8, wherein
the automatic exchange section has a traveling section configured to travel to a component warehouse that stores at least one of the feeder device and the carrier tape.

10. The tray-type component supply device according to claim 9, further comprising:
a height detection section configured to detect a height relationship between the device main body and the automatic exchange section; and
a height adjustment section configured to adjust an operation of exchanging the feeder device based on the detected height relationship.

11. The tray-type component supply device according to claim 10, wherein
the automatic exchange section has an accommodation section configured to accommodate the feeder device to be collected and the feeder device to be provided,
the height detection section is provided in the device main body to detect a height of the accommodation section of the automatic exchange section, and the height adjustment section is disposed between the automatic exchange section and the device main body to move the feeder device up and down based on the detected height of the accommodation section.

12. The tray-type component supply device according to claim 11, wherein the automatic exchange section has a exchange side feeder driving section and a exchange side control section configured to control the exchange side feeder driving section, the height adjustment section has an intermediate feeder driving section, and the device main body has a main body side feeder driving section configured to deliver the feeder device in cooperation with the exchange side feeder driving section and the intermediate feeder driving section, and a main body side control section configured to transmit and receive control information regarding delivery of the feeder device to and from the exchange side control section to control the main body side feeder driving section and the intermediate feeder driving section.

13. The tray-type component supply device according to claim 12, wherein the exchange side feeder driving section, the intermediate feeder driving section, and the main body side feeder driving section are transport rollers that transport the feeder device by being rotated in a state in which the feeder device is placed thereon.

\* \* \* \* \*